United States Patent [19]

Rowe

[11] 4,040,878
[45] Aug. 9, 1977

[54] SEMICONDUCTOR DEVICE MANUFACTURE

[75] Inventor: Colin M. Rowe, Manchester, England

[73] Assignee: U.S. Philips Corporation, New York, N.Y.

[21] Appl. No.: 668,946

[22] Filed: Mar. 22, 1976

[30] Foreign Application Priority Data

Mar. 26, 1975 United Kingdom ............... 12649/75

[51] Int. Cl.² .......................................... H01L 21/225
[52] U.S. Cl. ..................................... 148/188; 148/1.5; 148/187; 357/38
[58] Field of Search ................ 148/188, 186, 1.5, 187, 148/33.5; 357/38

[56] References Cited

U.S. PATENT DOCUMENTS

| 3,143,444 | 8/1964 | Lowe et al. ........................ 148/188 |
| 3,223,560 | 12/1965 | Millington ......................... 357/38 X |
| 3,574,009 | 4/1971 | Chizinsky et al. .................... 148/187 |
| 3,664,894 | 5/1972 | Einthoven et al. ................... 148/186 |
| 3,914,138 | 10/1975 | Rai-Choudhury ..................... 148/186 |
| 3,933,541 | 1/1976 | Hagino et al. ....................... 148/187 |
| 3,979,230 | 9/1976 | Anthony et al. ...................... 148/1.5 |

Primary Examiner—G. Ozaki
Attorney, Agent, or Firm—Frank R. Trifari

[57] ABSTRACT

Diffusion of aluminium into a silicon semiconductor wafer from an annular or grid pattern of deposited metallic aluminium to form a p-type annular zone at least 75 microns deep. The diffusion is performed in an oxidizing atmosphere to inhibit aluminium contamination of the wafer portion bounded by the p-type annular zone and in which for instance a thyristor may subsequently be formed. The aluminium may be diffused through the whole thickness of the wafer to form a peripheral zone of the thyristor body.

12 Claims, 5 Drawing Figures

SEMICONDUCTOR DEVICE MANUFACTURE

The invention relates to a method of manufacturing a semiconductor device comprising a silicon body with a portion forming at least one semiconductor device region, said portion being bounded by a deep p-type annular portion.

The invention further relates to a semiconductor device manufactured by such a method.

A method as described above is known from the U.K. Pats. Nos. 1,294,184 and 1,314,267.

A disadvantage of known methods for manufacturing deep annular p-type regions is the generally required very long diffusion times to achieve the necessary diffusion depth. Furthermore such very long diffusion times tend to degrade the silicon outside the p-type regions. This is in particular true for the silicon region bounded by said annular region since this bounded region is particularly subject to contamination by the p-type dopant.

The present invention provides a new and very satisfactory method of manufacturing a device comprising a deep p-type annular region.

The invention is based in the first place on the recognition that aluminium is a most suitable dopant for such a p-type annular region.

The invention furthermore is based on the idea that in order to achieve the desired result a specific aluminum source should be applied in a particular manner without using a diffusion mask. Moreoever the invention is based on the recognition that the diffusion should be carried out in a specific atmosphere in order to protect the silicon situated outside the aluminium source against degradation.

Aluminium is a known acceptor dopant in silicon and germanium semiconductor materials. It has a fast diffusion rate and is a good fit in the silicon lattice, so permitting the achievement of deep p-type and virtually strain-free diffused regions.

Aluminium diffusions are not widely used in semiconductor device manufacture at the present time. One conventional technique involves placing a quantity of aluminium and a silicon semiconductor body in a sealed and evacuated quartz chamber and heating so that the aluminium vapour formed acts on and diffuses into the silicon body. However, it is difficult to regulate the partial pressure of the aluminium vapour to control the amount of aluminium available for diffusion, especially if deep diffused junctions or high surface concentrations of aluminium are desired; this affects the reproducibility which can be achieved for the diffused aluminium dopant surface concentration. Furthermore, if more aluminium deposits on the surface of the semiconductor body than can be absorbed by direct diffusion into the body, a molten silicon-aluminium alloy is formed at the surface and penetrates into the body to interfere in an uncontrolled manner with the diffused aluminium region. To avoid these and other difficulties it is known to diffuse aluminium into a semiconductor body from an alumina source provided in contact with the semiconductor body surface. The diffusion is effected in a reducing atmosphere, for example hydrogen; it is found that an oxidizing or inert gas atmosphere results in either no diffusion or an irregular and uncontrollable diffusion.

These known aluminium-vapour and alumina techniques are not readily applicable to diffusing aluminium only locally at a major surface of the body (for example in an annular or grid pattern), and to a very large depth (for example at least 75 microns). The slow rate of liberation of aluminium for diffusion by the alumina technique results in very long diffusion times, for example several days, or even a week or more, to achieve such diffusion depths. Since aluminium diffuses rapidly through silicon oxide it is necessary to use less conventional masking materials, for example silicon nitride, to localise such deep diffusions. However, as is known in the art, several processing steps are necessary to define masking layer patterns of silicon nitride. Furthermore prolonged exposure of a diffusion-masking layer on the semiconductor body surface to aluminium vapour contaminates and degrades the layer, and can result in aluminium being diffused over the whole surface of the semiconductor instead of locally, so degrading portions of the body which are laterally bounded by the deep p-type region and which are desired to be used for other semiconductor device regions.

Having diffused aluminium dopant into a semiconductor body to a shallow depth, it is known to remove the aluminium diffusion source and then reheat the body to diffusion temperatures in for example air to drive the diffused aluminium dopant deeper into the body. However, it forms a peak aluminium doping which is spaced from the body surface and can result in non-uniform diffusion depths which are not readily reproducible for very deep p-type regions.

At the present time, in aluminium diffusions generally, the presence of free aluminium metal on the semiconductor body is considered undesirable. However it is known that aluminium ca be diffused into a semiconductor body by heating the body with a layer of aluminium on its surface. This technique is generally considered unsatisfactory since the aluminium penetrates the semiconductor surface by alloying with the semiconductor at the elevated temperatures necessary for the diffusion. However such aluminium alloy diffusions were tried and used for semiconductor device manufacture in the 1950's and were intended mainly for forming aluminium ohmic contacts to semiconductor bodies. In accordance with established alloying practice, such alloy diffusions were effected in a non-oxidizing atmosphere, uusually a hydrogen or nitrogen gas stream. In addition to the direct diffusion from the aluminium coating, part of the coating vaporizes on heating and the aluminium vapour diffuses into bare surface portions of the body not coated by the evaporated aluminium. It is not evident how such an aluminium diffusion could be localised to form a very deep p-type annular region (for example in a grid pattern) while avoiding the problems of providing suitable masking layers and of aluminium vapour contaminating the body portions bounded by the deep p-type region. In addition as a result of experiments leading to the present invention, the Applicants have found that if a silicon wafer body coated with a thick aluminium grid pattern is heated to diffusion temperatures there is a tendency for the molten aluminium to migrate from the grid tracks and run across the silicon surface within the grid (even if the silicon wafers are placed horizontally). This phenomenon, termed "streaking" is not fully understood but does result in unacceptable aluminium diffusion in the body portions which were to be bounded by the p-type grid and were to be used for other semiconductor device regions.

According to the present invention a method as described in the preamble is characterized in that the method comprises the steps of a. forming an aluminium-diffusion source on part of at least one major surface of a silicon semiconductor body by depositing aluminium to form a metallic layer having a thickness in the range of 0.2 micron to 5 microns and locally removing the layer to leave a metallic aluminium pattern comprising at least one annular portion, b. subjecting the body in an oxidizing atmosphere to one or more heating stages during which the body is heated at such a temperature and for so long a period to diffuse aluminium into the body from said aluminium pattern to form a deep p-type region with a total depth of at least 75 microns which extends locally in said body from said major surface and comprises at least one deep p-type annular portion, the oxidizing atmosphere serving to inhibit diffusion of the aluminium in the body except in the form of said deep p-type region, a silicon oxide layer which grows in said oxidizing atmosphere at the silicon surface portions not covered by the aluminium pattern serving to extract aluminium from underlying body portions and transport said aluminium into the oxidizing atmosphere, and c. removing from the body the residue of the diffusion source and the silicon oxide layer to leave the deep diffused p-type region, the portion of the body bounded by the deep p-type annular portion being used for at least one semiconductor device region.

Using this method, a very deep p-type annular portion can readily be formed in a semiconductor body by aluminium diffusion without the aluminium contaminating the body portion which is bounded by the deep p-type annular portion and which is used for at least one semiconductor device region. The provision of an aluminium-diffusion source comprising such a metallic aluminium pattern to localise the diffusion avoids problems of suitable diffusion masking layers. The oxidizing atmosphere inhibits the diffusion of aluminium vapour into the unmasked body portions as described hereinafter in greater detail. The streaking tendency of the aluminium can be reduced by choosing a thin metallic aluminium pattern and by oxidation of its surface during (or, if desired, before) the heating step (b). By removing the residue of the diffusion source (including any oxidized and alloyed portions of the aluminium pattern) the possibility is removed of these residues acting as aluminium-diffusion sources during the subsequent processing of the semiconductor body which may involve forming other semiconductor device regions (for example by further dopant diffusions).

The Applicants have found that alloying of the aluminium with the semiconductor can be avoided by interposing a silicon oxide layer of suitable thickness between the metallic aluminium pattern and the semiconductor as described hereinafter. However, a longer diffusion time is then required to obtain the same diffusion depth with the same diffusion temperature. The Applicants have also found that when using a thin pattern of aluminium this intermediate oxide layer can be omitted without the penetration caused by alloying reaching an unacceptable level. Therefore, preferably the thickness of the metallic aluminium pattern is at most 2 microns. Prior to the heating step (b), the metallic aluminium pattern may be coated with for example an oxide (for example by anodizing or by evaporation/sputtering) to reduce the steaking tendency of the aluminium. However the Applicants have found that such an oxide coating can be omitted by minimising the volume of the metallic aluminium pattern to avoid streaking. Therefore, for this reason also, the thickness of the metallic aluminium pattern is preferably at most 2 microns, and even approximately 1 micron or less. However, to obtain a reliable and readily reproducible doping concentration and depth for the deep p-type region in step (b), it should be ensured that the diffusion-source is not depleted of aluminium before the diffusion of step (b) is completed; this determines a minimum thickness for the metallic aluminium pattern for a particular application of the method.

By increasing the temperature or diffusion time, the p-type region can be diffused deeper than 75 microns in step (b). Diffusion depths of at least 100 microns can readily be achieved with diffusion times of at least 12 hours. Preferably, the diffusion temperature is at least 1200° C but is typically less than 1,350° C. Thus, for example, the heating may be effected at a temperature of at least 1,200° C for more than 20 hours to diffuse the aluminium to a total depth of at least 150 microns. The deep p-type region may of course diffuse further during heating in subsequent processing steps, for example, to form other semiconductor device regions in the body.

If, with the diffusion-source used, alloying occurs between the aluminium pattern and the silicon, the alloying as well as the diffusion should be effected in an oxidizing atmosphere. The alloying and diffusion can be effected in separate heating stages each in an oxidizing atmosphere by initially heating the body to a temperature below 1,000° C for a short time to effect the alloying after which the body may be cooled, if so desired, and then heated to at least, 1,100° C for at least 6 hours in a further oxidizing atmosphere to effect the aluminium diffusion; however, this involves extra processing steps. Therefore, the Applicants prefer to allow any such alloying to occur at the beginning of the heating used for the aluminium diffusion.

The annular portions of the metallic aluminium pattern and the deep diffused p-type region may be in the form of one or more separate rings, if so desired; such rings need not be circular but may be, for example, square, rectangular, triangular or any other desirable shape. However, these annular portions may form part of a larger grid pattern so that a deep p-type grid can be diffused into the body.

Methods in accordance with the present invention are particularly suitable for forming device structures where a deep p-type grid forms a peripheral zone which extends locally through the semiconductor body to a p-type region at the opposite major surface, and where the semiconductor body is subsequently divided along the p-type grid into individual semiconductor device bodies. Such structures are at present desirable for passivated thyristors and other rectifiers such as those described in the Specifications of U.K. Pats. Nos. 1,294,184 and 1,314,267 and Belgium Patent No. 839,971. Reference is invited to these Specifications, the contents of which are hereby incorporated into the present Specification.

An embodiment of the present invention will now be described, by way of example, with reference to the accompanying diagrammatic drawings, in which.

The Figures are not drawn to scale, and, in particular, dimensions of certain layers in the direction of thickness of wafer 1 are exaggerated for the sake of clarity.

Figure 1:
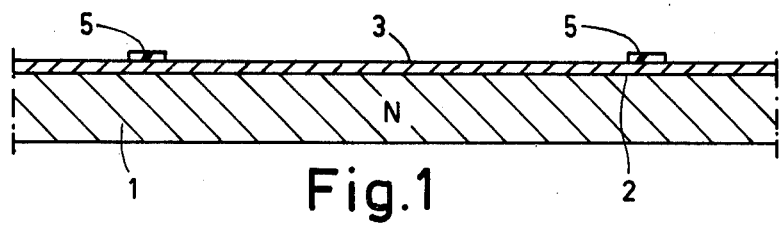
FIG. 1 is a cross-sectional view of part of a semiconductor wafer at an early stage in the manufacture of a semiconductor device by a method in accordance with the present invention.

The semiconductor body portion 1 shown in FIG. 1 is part of a monocrystalline silicon semiconductor wafer having an n-type conductivity and a high resistivity. Typically, the resistivity of wafer 1 may be, for example, at least 15 ohm-cm. The wafer 1 is typically for example approximately 200 microns thick.

Figure 2:
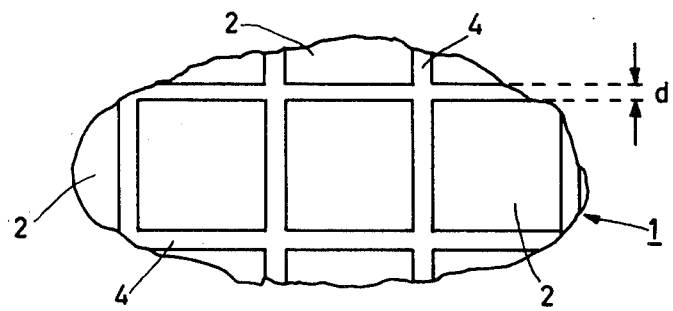
FIG. 2 is a plan view of part of the wafer of FIG. 1 on a smaller scale showing the grid pattern.

Aluminium is deposited on a major surface 2 of the wafer 1 to form a metallic aluminium layer 3 typically having a thickness of around 1 micron. The aluminium can be deposited in known manner by evaporation in vacuum or by sputtering, and during the deposition the wafer 1 may be heated to a low temperature, for example 200° C or less. The Applicants have found that a minimum aluminium thickness of about 1 micron is needed to obtain uniform diffused junctions at a depth in the range of 140 to 180 microns. A smaller aluminium thickness usually results in partial depletion of the aluminium diffusion source causing variations to the desired junction depth. Too large a thickness, however, can result in aluminium "streaking" as previously described. By a standard photolithographic and etching technique parts of the layer 3 are removed to leave annular portions which are joined together in a square grid pattern 4 (see FIG. 2) on the surface 2 of the wafer 1. FIG. 1 shows the step prior to etching the aluminium using as an etchant-mask a grid pattern of polymerised photoresist 5 present on the aluminium layer 3. By using photolithographic and etching techniques a particularly well-defined aluminium grid pattern 4 with sharp corners can readily be formed which assists in avoiding aluminium streaking. A typical dimension for the width $d$ of the aluminium tracks of the grid pattern 4 is for example approximately 50 microns to 150 microns. The Applicants have found that the uniformity of junctions diffused to depths of 140 to 180 microns can be adversely affected if the track widths are too small. The Applicants have also found that if too large a track width is used, streaking of the aluminium can reoccur. The areas within the grid are determined by the device structure to be formed, and may be for example 4 mm. by 4 mm. The pattern 4 provides an aluminium diffusion source.

Figure 3:
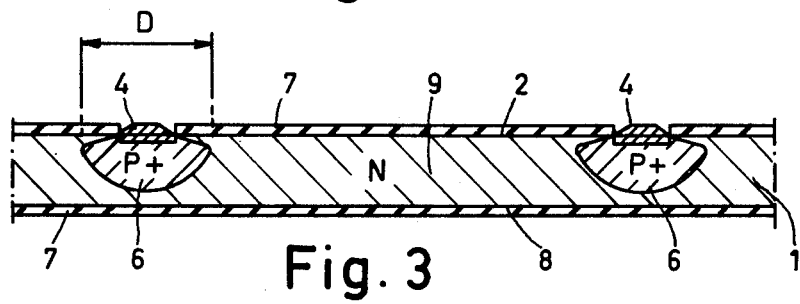
FIGS. 3 to 5 are cross-sectional views of the part of the semiconductor wafer of FIG. 1 at subsequent stages of manufacture.

The wafer 1 with the aluminium grid pattern 4 thereon is then placed in a conventional diffusion-furnace tube and heated in an oxidizing atmosphere at a temperature of at least 1,100° C for at least 6 hours to diffuse aluminium from the grid pattern 4 in wafer 1 to a depth of at least 75 microns. For the manufacture of the device of FIG. 5, typical values are a temperature of 1,260° C for 32 hours to diffuse the aluminium to a depth of approximately 160 microns. As shown in FIG. 3, the aluminium diffuses from the grid pattern 4 to form a p-type grid 6 in the n-type wafer 1. As usual, the aluminium diffuses laterally in the body as well as the direction of thickness, so that a resulting 160 microns deep p-type grid has a maximum width D of approximately 300 to 400 microns. The doping concentration of the p-type grid 6 is determined by the solid solubility of aluminium in silicon at the diffusion temperature, and typically has a value of about $3 \times 10^{19}$ atoms/c.c. The doping profile approximates the "error function" case with a peak value adjacent the alloying front. Because the ionic radii of the aluminium atoms (1.29A) is comparable with the tetrahedral covalent radii of silicon (1.17A) no significant lattice damage occurs in the wafer 1 and the elastic limit of silicon is not reached, even at concentrations as high as the solid solubility limit and with such large diffusion depths.

At the elevated temperatures required for the diffusion the aluminium grid pattern 4 alloys with the underlying semiconductor material. Generally speaking, the depth of alloying in wafer 1 is approximately three times the thickness of the aluminium pattern 4. Thus, the alloying front is well-over 100 microns from the p—n junction which the p-type grid 6 forms in the n-type wafer 1. In addition, as described hereinafter the alloyed zone occurs in a peripheral and comparatively inactive area of the semiconductor device, and the alloy is subsequently wholly removed by etching.

The oxidizing atmosphere in which the aluminium diffusion is effected may be air. However, preferably the atmosphere comprises a stream of filtered nitrogen and oxygen; the proportions are not critical, but 10% to 25% oxygen is preferred. Other gases may of course be added to the gas stream, if so desired. This oxidizing atmosphere is passed over the wafers 1 in the furnace tube. Both the bare surface of the silicon wafer 1 and part of the aluminium pattern 4 are oxidized in this atmosphere at these elevated temperatures. FIG. 3 shows the silicon oxide layer 7 thus formed at the opposite major surfaces 2 and 8 of the wafer 1. The thickness of layer 7 is typically less than 0.5 micron.

The effect of the oxidizing atmosphere is to confine the aluminium diffusion to that of the p-type grid 6. Thus, the outer surface of the aluminium pattern 4 rapidly oxidises to alumina, after which the growth rate of the aluminium oxide declines rapidly and so does the loss of aluminium by evaporation from the pattern 4. This alumina coating also assists in preventing streaking and in preventing bulk reactions between the aluminium and the silicon oxide layer 7 growing at the surface. A small amount of aluminium may still vaporize, but this aluminium vapour itself becomes oxidized and it swept away in the gas/air stream. Although the silicon oxide layers 7 formed in the oxidizing atmosphere are thin, they play a significant role in preventing aluminium contamination and degradation of the n-type portions 9 of the wafer which are laterally bounded by the diffused p-type grid. Thus, as the layer 7 is grown impurities in the silicon will distribute themselves beween the silicon and the growing oxide 7. The segregation coefficient ($m$) is the ratio of equilibrium concentration of impurity in the semiconductor to that in the oxide at the semiconductor/oxide interface. It is commonly accepted that (for dry oxidation systems) if $m$ is less than approximately 2.27, the oxide will deplete the impurity from the semiconductor. For aluminium, $m$ is approximately $10^{-3}$ so that aluminium penetrating into the silicon regions 9 bounded by the grid 6 or along the oxide/silicon interface will be depleted into the oxide 7. In addition, aluminium diffuses several hundred times faster in the thermal oxide 7 than in silicon; therefore the aluminium in the oxide 7 will rapidly diffuse through the oxide layer 6 and on reaching the free surface of layer 7 will be lost in the gas stream, probably as volatile $Al_2O$. The depletion effect of the oxide 7 is sufficient to encourage outdiffusion of the aluminium surface doping of the p-type grid 6 where immediately underlying the oxide 7, as indicated in FIG. 3. However the effect is insufficient to seriously affect the advance of the diffusion front into the wafer.

It should be noted that the Applicants have tried alloying the grid pattern 4 to the silicon surface 2 at a lower temperature in a nitrogen atmosphere and subsequently diffusing aluminium from the alloyed zone to a deep level by heating to diffusion temperatures in an oxidizing atmosphere. However, in the experiments conducted, aluminium was found to have contaminated and degraded the n-type areas 9 between the grid 6. The Applicants have concluded that if a process is used in which the aluminium pattern 4 alloys with the silicon, both the alloying and the diffusion should be effected in an oxidizing atmosphere. This is in direct opposition to the established teaching in the semiconductor alloying and alloy-diffusion art. As a result of the oxidizing atmosphere (rather than an inert or reducing atmosphere) the aluminium source is partially consumed by oxidation. However, the initial rapid formation of an alumina coating on the pattern 4 impedes subsequent oxidation of the remaining aluminium so that sufficient remains for the very deep localised diffusion. In spite of the oxidizing atmosphere, the aluminium has been found to wet readily to a thin silicon oxide layer usually present on the silicon surface and having reacted with this thin oxide layer, the aluminium then alloys with the underlying silicon. The molten aluminium is thought to decompose this thin layer into silicon and oxygen which dissolve in the metal, the oxygen then diffusing to the aluminium surface to be incorporated into the alumina coating.

Thus, by oxidation of aluminium (both vapour and metal) and by growth of the silicon oxide layers 7, the oxidizing atmosphere serves to inhibit diffusion of the aluminium in the n-type wafer 1 except in the form of the p-type grid 6. As a result, the n-type portions 9 of the wafer which are laterally bounded by the p-type grid 5 are not contaminated and degraded by the aluminium and are suitable for forming other regions of the semiconductor device.

Figure 4:
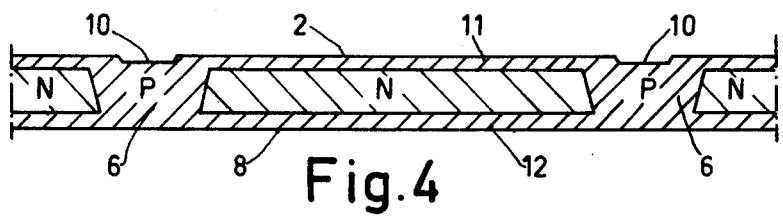

Before forming such other regions it is necessary to remove the remains of the aluminium diffusion source from the wafer 1. Preferably, to ensure complete removal of the aluminium pattern 4 (including its oxidized and alloyed portions) the silicon adjacent the pattern 4 is also removed. This can be effected in a simple and convenient manner using the oxide layers 7 as etchant-masks to protect the remainder of the wafer surface. The etch-removal can be effected using known etchants for aluminium and silicon. As a result of the etching a grid pattern depression 10 (see FIG. 4) is formed in the surface of the p-type grid 6. A typical depression 10 may have a depth of for example 5 to 10 microns. The depression can be used as a convenient means of alignment for subsequent operations, for example further photolithographic steps, and scribing or sawing techniques for separating the wafer into individual device bodies. Usually such a depression will be detectable in the manufactured semiconductor device. After removing the aluminium grid pattern 4, the oxide layers 7 which may contain dissolved aluminium and other impurities are removed by subjecting the wafer 1 to a known etchant for silicon oxide.

Subsequently the n-type wafer 1 with the p-type grid 6 may be subjected to a known boron diffusion treatment, for example at 1,260° C for 25 hours to diffuse boron into the surface of the wafer 1 to a depth of approximately 40 microns. In this manner p-type boron-doped surface layers 11 and 12 are formed adjacent the major surfaces 2 and 8 respectively of the wafer 1, see FIG. 4. During this diffusion treatment, the p-type aluminium-doped grid 6 diffuses further in the body, and the p-type surface layer 12 and the p-type merge together.

Figure 5:
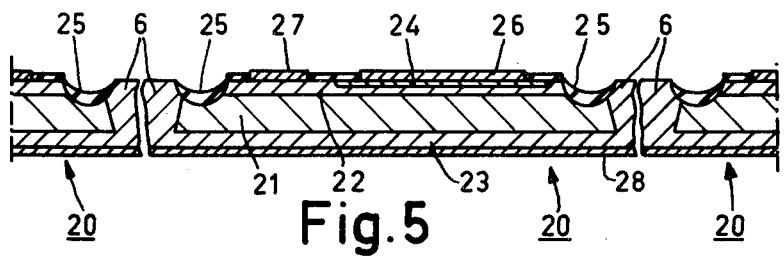

The wafer 1 may then be further processed in known manner to form the device shown in FIG. 5. This device is a glass-passivated thyristor comprising an individual device body 20 separated from wafer 1. In the body 20, the p-type grid 6 forms a peripheral zone. The body portion bounded by this peripheral zone 6 comprises an n-type base 21 formed by the original material of the wafer 1, a p-type base 22 formed by the boron-doped surface layer 11, a p-type emitter (anode) 23 formed by the boron-doped surface layer 12, and an n-type emitter (cathode) 24 formed by, for example, a phosphorus-doped zone provided in the layer 22. The p-type base 22 is laterally bounded by an annular etched moat 25 partially filled with glass. The p-type peripheral zone 6 serves to extend the $p-n$ junction between regions 21 and 23 (the anode junction) to the top surface of the body 20 to terminate this junction at the glass passivation in moat 25. The cathode 24, p-type base 22 and anode 23 are provided in known manner with electrodes 26, 27 and 28 respectively. The wafer 1 is divided into the bodies 20 by sawing, laser scribing, or cracking through the p-type grid 6. Advantages of such a device structure are described in said U.K. Pat. No. 1.314.267.

It will be evident that many modifications are possible within the scope of the present invention. Prior to aluminium evaporation a very thin silicon oxide layer (for example about 15 A thick) is often present on surface 2, and during the diffusion the aluminium pattern 4 will penetrate this thin layer to alloy with the silicon. However the aluminium can be deposited on a much thicker oxide layer on the silicon surface to prevent alloying if so desired. The oxide may be alumina, for example formed by deposition of evaporated alumina or anodising a predeposited aluminium layer, or it may be for example deposited or thermally-grown silicon oxide. In particular, the Applicants have found that the desired deep aluminium diffusion can be effected without alloying into the silicon surface 2 by providing the aluminium grid pattern 4 (1 micron thick) on a thermally-grown silicon oxide layer having a thickness greater than 2 microns. Such a thick silicon oxide layer may be formed over the whole of surface 2 and would then grow thicker in the oxidizing atmosphere of the diffusion step, where not covered by the aluminium pattern 4. A disadvantage is the increased diffusion times which are necessary, for example 14 hours and 110 hours to achieve aluminium diffusion depths of at least 75 microns and approximately 170 microns respectively. After being formed, the metallic aluminium pattern 4 may be coated, if desired, to further inhibit aluminium streaking and vaporisation during diffusion. Such coating may be, for example, with alumina (by deposition or anodization) or silicon oxide.

The aluminium diffusion can be effected in the semiconductor wafer from opposite major surfaces 2 and 8 by providing metallic aluminium patterns 4 in registration on each of these surfaces. This can be particularly useful for reducing diffusion times for aluminium diffusion through thicker wafers The aluminium diffusion process can obviously be used to form other semiconductor devices. Particularly important is the thyristor described in Belgium Pat. No.

839,971 in which the moat 25 is replaced by two annular concentric moats. The boron diffusion into surface 2 is locally masked to provide an annular n-surface portion between these two subsequently formed moats, and a highly-doped channel-stopper region is provided between the moats.

The grid pattern 4 need not be square, but other shapes are possible if desired for the semiconductor device to be manufactured; thus, for example, the grid may enclose rectangular or triangular areas for example. To reduce the tendency for aluminium streaking, large widths or volumes of aluminium should generally be avoided so that it is generally preferable for a grid pattern 4 to be provided with sharp rather than curved corners. However, the aluminium need not be provided in a grid pattern when used for other types of semiconductor device, thus, if so desired the metallic aluminium pattern which provides the diffusion source may comprise one or more separate rings and such rings may be, for example, circular, rectangular or of any other desired shape. Furthermore, the deep p-type region formed by the aluminium diffusion need not be used to form a zone extending around the periphery of the semiconductor body, but may be used in other types of device for, for example, separating portions of the device body from each other (for example for electrical isolation between circuit-element regions in the body). In addition in other types of device, the deep p-type region formed by the aluminium diffusion need not extend through the thickness of the device body. In the manufacture of some devices, if so desired the body portion laterally bounded by the deep aluminium-doped annular portion need not be subsequently locally overdoped with other dopant, so that if so desired the p–n junction between this body portion and the deep annular portion may be used for a diode junction.

There may of course be small breaks or discontinuities in the metallic aluminium tracks which form the annular portions of the grid pattern 4 or the separate rings; in this case a continuous p-type grid or ring can still be formed in the wafer body because of the lateral diffusion if the aluminium dopant in the body.

Finally it is stressed that, when an aluminium diffusion is effected from aluminium patterns provided in registration on both of the opposite major surfaces of the body, the total depth of the diffused p-type region is understood to be the sum of the depths of the portions adjoining each of said major surfaces even in a stage of manufacturing where they do not yet merge.

What is claimed is:

1. A method of manufacturing a semiconductor device comprising a silicon semiconductor body with a portion forming at least one semiconductor device region, said portion being bounded by a deep p-type annular portion, said method comprising the steps of:
   a. providing an aluminum diffusion source on part of at least a first major surface of said silicon semiconductor body by depositing aluminum to form a metallic layer having a thickness in the range of 0.2 micron to 5 microns and locally removing parts of said metallic layer to leave a metallic aluminum pattern comprising at least one annular portion,
   b. subjecting said body in an oxidizing atmosphere to one or more heating states during which the body is heated under temperature and time conditions so as to diffuse aluminum from said aluminum pattern into said body to form in said body a deep p type region with a total depth of at least 75 microns, which region extends locally in said body from said first major surface and comprises at least one deep p type annular portion, said oxidizing atmosphere serving to inhibit diffusion of aluminum in said body except in the form of said deep p type region,
   c. growing a silicon oxide layer by said oxidizing atmosphere at portions of said first major surface not covered by said aluminum pattern, said silicon oxide layer serving to extract aluminum from underlying parts of said body and to transport said extracted aluminum into the oxidizing atmosphere,
   d. removing from said body the residue of said diffusion source and said silicon oxide layer to leave said deep diffused p type region, and
   e. providing at least one further semiconductor device region at the portion of said body bounded by said deep p-type annular portion.

2. A method as in claim 1, wherein the thickness of the metallic aluminum pattern is at most 2 microns.

3. A method as in claim 1, wherein said annular portion of metallic aluminum forms part of a grid pattern of metallic aluminum, and the diffused p type annular portion formed in step (b) is part of a deep p type grid diffused in said body from said aluminum grid pattern.

4. A method as in claim 3, wherein said aluminum grid pattern comprises tracks having a width in the range of 50 to 150 microns.

5. A method as in claim 1, wherein said step of heating said body with the aluminum diffusion source is effected under such conditions of temperature and time that aluminum is diffused to a total depth of at least 150 microns.

6. A method as in claim 1, wherein said metallic aluminum pattern alloys with the underlying semiconductor material at said major surface, said alloying occurring in an oxidizing atmosphere during the heating recited in step (b), and the alloyed portion of the aluminum pattern thereafter is removed in step (c).

7. A method as in claim 1, wherein said metallic aluminum pattern is exposed to the oxidizing atmosphere and partially oxidized during step (b), and the oxidized portion of said aluminum pattern is thereafter removed in step (c).

8. A method as in claim 1, wherein said silicon oxide layer is formed by oxidation of said silicon surface portions in the oxidizing atmosphere in step (b), and is used in step (c) as an etchant-mask while subjecting said semiconductor body to an etching treatment to remove said residue of said aluminum diffusion source.

9. A method as in claim 1, said further semiconductor region is provided by at least one further dopant diffusion treatment during which at least one further treatment said deep p type region diffuses further in said body.

10. A method as in claim 1, wherein, after step (c), said semiconductor body is subjected to a further p type diffusion treatment at least at the opposite major surface of said body to provide thereat a p type surface layer forming a p,n junction located in said body and to diffuse said deep p type region further in said body, merging said deep p type region with said p type surface layer to extend said p,n junction toward said first major surface.

11. A method as in claim 1, wherein a plurality of semiconductor devices are formed from said semiconductor body and subsequently dividing said body through said deep p type region, into individual device bodies.

12. A method as in claim 1, wherein said aluminum diffusion is effected into said body from metallic aluminum patterns provided in registration on both of said major surfaces of said body.

* * * * *

UNITED STATES PATENT OFFICE
CERTIFICATE OF CORRECTION

Patent No. 4,040,878     Dated August 9, 1977

Inventor(s) Coltin M. Rowe

It is certified that error appears in the above-identified patent and that said Letters Patent are hereby corrected as shown below:

Column 2, line 32 "ca" should read -- can --.

Column 6, line 49, "beween" should read -- between --.

Column 6, line 63, "6" should read -- 7 --.

Column 7, line 38, "5" should read -- 6 --.

Column 9, line 40, "if" should read -- of --.

Signed and Sealed this

Twenty-seventh Day of December 1977

[SEAL]

Attest:

RUTH C. MASON
Attesting Officer

LUTRELLE F. PARKER
Acting Commissioner of Patents and Trademarks